United States Patent [19]
Wei et al.

[11] Patent Number: 5,929,845
[45] Date of Patent: Jul. 27, 1999

[54] IMAGE SCANNER AND DISPLAY APPARATUS

[75] Inventors: Chengping Wei, Gilbert, Ariz.; Hsing-chung Lee, Calabasas, Calif.; Franky So, Tempe, Ariz.

[73] Assignee: Motorola, Inc., Schaumburg, Ill.

[21] Appl. No.: 08/707,035

[22] Filed: Sep. 3, 1996

[51] Int. Cl.$^6$ .................................. G09G 5/00
[52] U.S. Cl. ............................................. 345/156
[58] Field of Search .................... 345/156, 155, 345/104, 87, 82, 76; 382/312, 313, 318, 319

[56] References Cited

U.S. PATENT DOCUMENTS

| | | | |
|---|---|---|---|
| 3,696,393 | 10/1972 | McDonald | 340/324 |
| 4,495,409 | 1/1985 | Baji et al. | 250/211 |
| 5,070,467 | 12/1991 | Todome | 395/166 |
| 5,365,605 | 11/1994 | Hosogoe et al. | 382/59 |
| 5,550,938 | 8/1996 | Hayakawa et al. | 382/313 |
| 5,684,368 | 11/1997 | Wei et al. | 315/302 |
| 5,693,956 | 12/1997 | Shi et al. | 257/40 |

*Primary Examiner*—Mark K. Zimmerman
*Assistant Examiner*—Ronald Laneau
*Attorney, Agent, or Firm*—Eugene A. Parsons; William E. Koch

[57] ABSTRACT

Image scanner and display apparatus including an array of organic electroluminescent devices, each device operating as a light emitter when forward biased and as a light detector when reverse biased. Electronics coupled to the array and having a display mode and a scanner mode, the electronics sequentially forward biasing the array of organic electroluminescent devices, one row at a time, to emit light in the display mode, and sequentially forward biasing alternate columns of devices to emit light, one column at a time, and reverse biasing an associated column of devices for detecting light in the scanning mode, whereby light emitted from a forward biased column and reflected by information being scanned is received by the reverse biased associated column.

14 Claims, 2 Drawing Sheets

IMAGE SCANNER AND DISPLAY APPARATUS

FIELD OF THE INVENTION

The present invention pertains to image scanners and more particularly to improved image scanners.

BACKGROUND OF THE INVENTION

Generally, image scanners are useful for converting information, such as typed or written pages of information, pictures, drawings, photographs, and the like into digital data. The digital data is then in a convenient form for storage or transmission to remote displays where it can again be converted back to its original form, or it can be easily operated upon to change the original form to a more desirable form.

In the prior art, scanners generally include a line or row of light and an associated row of light detectors. To scan a page of information, either the prior art devices must be physically moved across the page or the page is moved across the device. The major problem that arises is that the light detectors and the physical movement must be synchronized so that appropriate digital signals are generated. This synchronization is essential and if it is altered by wear, jarring, or other factors present during normal usage, the digital signals produced will be erroneous and not provide a true representation of the data scanned. Also, the mechanism providing the physical movement is generally large and expensive.

Accordingly, it would be highly advantageous to have a scanner which does not require physical movement.

It is a purpose of the present invention to provide a new and improved scanner.

It is another purpose of the present invention to provide a new and improved scanner which does not require physical movement for scanning.

It is still another purpose of the present invention to provide a new and improved scanner which is relatively simple and inexpensive to manufacture.

It is a further purpose of the present invention to provide a new and improved scanner which is relatively small and requires low operating power so that it can easily be incorporated into electronic devices, and especially portable electronic devices.

It is still a further purpose of the present invention to provide a new and improved scanner which is easily integrated with a display.

SUMMARY OF THE INVENTION

The above problems and others are at least partially solved and the above purposes and others are realized in an image scanner and display including an array of photonic devices arranged into rows and columns, the columns of photonic devices include a first plurality of spaced apart columns of light emitting devices and a second plurality of columns of light detecting devices alternately positioned between the first plurality of spaced apart columns of light emitting devices so that each column of the first plurality of spaced apart columns has an associated second column of light detecting devices. Electronics are coupled to the array of photonic devices so as to sequentially energize the first plurality of spaced apart columns of light emitting devices, one column at a time, to emit light and to energize the associated second column of light detecting devices for each first column energized, whereby light emitted from energized first columns and reflected by information being scanned is received by the associated second column.

In a preferred embodiment, each of the photonic devices is an organic electroluminescent device which operates as a light emitter when properly energized, generally forward biased, and operates as a light detector when properly energized, generally reverse biased. The electronics are coupled to the array in a display mode so that the organic electroluminescent devices are all forward biased, one row at a time, in accordance with image data supplied to an input. The electronics are coupled to the array in a scanning mode so that alternate columns of the organic electroluminescent devices are forward biased, one pixel at a time, and an associated column of the organic electroluminescent devices is reverse biased to detect light emitted from a forward biased pixel and reflected by information being scanned.

BRIEF DESCRIPTION OF THE DRAWINGS

Referring to the drawings.

DESCRIPTION OF THE PREFERRED EMBODIMENTS

Figure 1:
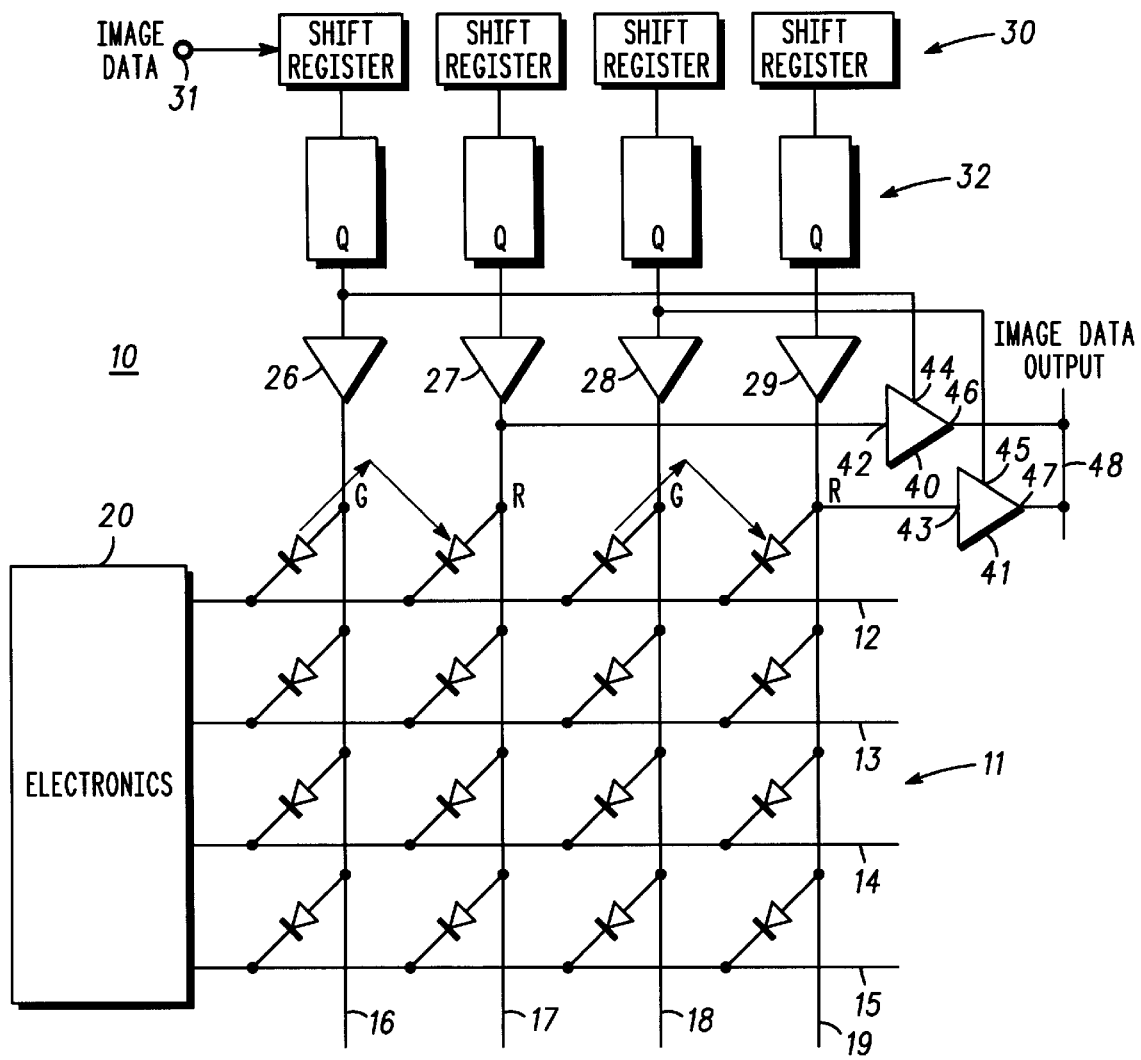
FIG. 1 is a schematic/block diagram of image scanner and display apparatus in accordance with the present invention.

Referring specifically to FIG. 1, a schematic/block diagram of image scanner and display apparatus 10 in accordance with the present invention is illustrated. Apparatus 10 includes an array 11 of photonic devices arranged in rows, represented by row conductors 12–15, and columns, represented by column conductors 16–19. It will of course be understood that array 11 is greatly reduced for simplicity of the drawing and will generally have many more rows and columns, with those illustrated being simply for purposes of this illustration. It should also be understood that the rows and columns can easily be interchanged or otherwise arranged by those skilled in the art and all such changes or arrangements are intended to come within the language of the claims.

The individual photonic devices of array 11 are each capable of operating as either a light emitting device or a light detecting device, in accordance with the specific energization being applied. In a preferred embodiment the photonic devices are organic electroluminescent devices which operate as light emitting devices when forward biased and operate as light detecting devices when reverse biased, as will be explained in more detail presently. For this embodiment, as illustrated in FIG. 1, each photonic device has an anode connected to a column conductor and a cathode connected to a row conductor.

Each row conductor 12–15 is connected to an electronic circuit 20. Each column conductor 16–19 is connected to a column driver 26–29, respectively. A shift register 30, illustrated with four stages, receives image data from a terminal 31 (either serially or in some parallel combination) and supplies the image data, one complete row at a time, to a four stage buffer circuit 32. Buffer circuit 32 in turn supplies the image data to array 11 by way of column drivers 26–29. Also, output amplifiers, or drivers, 40 and 41 are supplied, each having a data input terminal 42 and 43, a control terminal 44 and 45 and an output terminal 46 and 47, respectively. Data input terminal 42 of amplifier 40 is connected to the output of driver 27 and control terminal 44 is connected to the input of driver 26. Data input terminal 43 of amplifier 41 is connected to the output of driver 29 and control terminal 45 is connected to the input of driver 28. Output terminals 46 and 47 of amplifiers 40 and 41 are both connected to an image data output line 48.

Apparatus 10 has two modes of operation: a display mode in which the photonic devices are sequentially energized, one row at a time, in accordance with data supplied to the electronics to emit light and provide an image representative of the data; and a scanner mode in which a first plurality of spaced apart pixels of light emitting devices are energized, one pixel at a time, to emit light and an associated detecting device is energized for each first pixel energized, whereby light emitted from energized first pixels and reflected by information being scanned is received by the associated detectors.

In the display mode of operation, image data is supplied to terminal 31 from some source of data and the image data is shifted into shift register 30 in a complete row of data. The complete row of data is then shifted out of shift register 30 and into buffer 32 while the next row of data is moved into shift register 30. The complete row of data is supplied to array 11 through column drivers 26–29. Simultaneously, the correct row for the data is selected by electronic circuit 20. Generally the rows are selected sequentially, which allows the use of some simple electronics, such as a shift register. As is known in the art, each individual photonic device is addressed by selecting the column conductor and the row conductor connected to it. Thus, by means of electronic circuit 20, such as a shift register or the like, each row conductor 12–15 is sequentially connected to a current sink and a common (e.g. ground) to complete the circuit.

In this display mode of operation addressed photonic devices in array 11 are forward biased so as to emit light. Generally, the data applied by drivers 26–29 is a positive signal and may be a simple high (e.g. 5v) or low (e.g. 0v) pulse representative of ON or OFF, respectively, or it may be one level of a multiple level gray scale. Electronics circuit 20 supplies a substantially ground potential to a specific row being addressed while all of the remaining rows are held at a plus 10V or simply disconnected) to bias them OFF.

In the scanner mode of operation, a first plurality of spaced apart columns of photonic devices are selected as the emitting columns, which in this embodiment are columns 16. 18, etc. A second plurality of columns of photonic devices, which in this embodiment are columns 17, 19, etc., are selected so as to be alternately positioned between the first plurality of spaced apart columns of photonic devices and, thus, each column (e.g. column 16) of the first plurality of spaced apart columns has an associated second column (e.g. column 17) of photonic devices adjacent thereto. The photonic devices in the selected first column (e.g. column 16) are forward biased, or biased to emit light, one device at a time or across the entire column. The photonic devices in the associated second column (e.g. column 17) are reverse biased to operate as light detectors, with each photonic device in column 16 having an associated photonic device in column 17.

As a typical example, array 11 is formed with a photonic device in column 16, designated G (for green emission) and a photonic device in column 17, designated R (for red emission) forming a single pixel in the display. All of the remaining photonic devices are formed in similar pairs to define pixels of the display. In this fashion, in the display mode, the image may be displayed in color. Also, the pairs of photonic devices are positioned so that light from an emitting device will be reflected from an information medium, such as paper or the like, onto the detecting device of the pair. In this embodiment crosstalk (i.e. light from one photonic device being sensed by the detector of a different pair) between adjacent pairs is eliminated by only activating or energizing one pair at a time. However, an entire column could be energized if the pairs of photonic devices were fabricated so that crosstalk would not occur.

An image data readout circuit is provided and includes amplifiers 40, 41, etc. Amplifier 40, for example, is connected to be turned ON by a positive bias applied to column 16 through driver 26. Further, data input 42 of amplifier 40 is connected to receive signals produced by activated light detectors in column 17 as reflected light is sensed. Similarly, amplifier 41 is connected to be turned ON by the bias applied to column 18 and to sense signals produced on column 19. Since the entire array 11 is scanned or swept, each pair of photonic devices in columns 16 and 17, then each pair of photonic devices in columns 18 and 19, etc., the image data on output line 48 will be a continuous electrical (generally digital) representation of the image being scanned.

Figure 2:
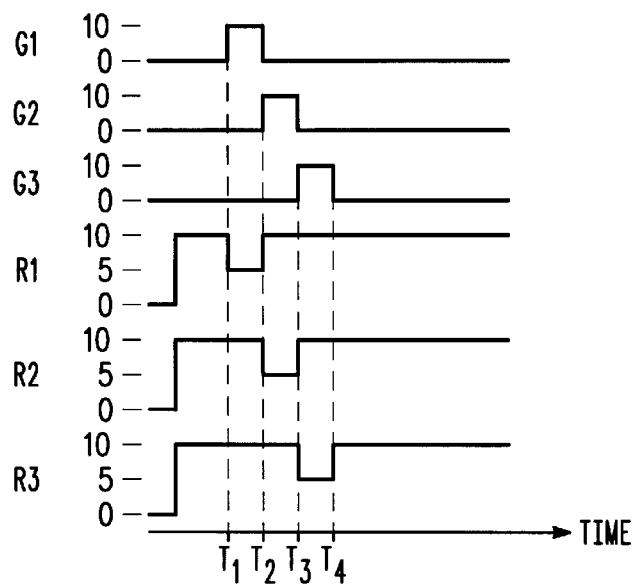
FIG. 2 illustrates timing pulses for the operation of the apparatus of FIG. 1.

In this specific embodiment, to forward bias one photonic device of a pair while reverse biasing the other photonic device in the pair, a potential of 10v is applied by driver 26, for example, to column 16. Simultaneously, a potential of 0v is applied by driver 27 to column 17 and a potential of 5v is applied by electronic circuit 20 to row 12. Thus, the photonic device (designated G) addressed by column 16 and row 12 is forward biased (5v) and emits light while the photonic device addressed by column 17 and row 12 (designated R) is reverse biased (5v) and operates to detect light. At the same time, each of the other rows (unaddressed rows) are held at a potential of 10v while unaddressed first columns (e.g. column 18) have a potential of 0v applied thereto and unaddressed second columns (e.g. column 19) have a potential of 10v applied thereto. Thus, all other photonic devices in array 11 are biased so as not to emit light. Further, all other amplifiers (e.g. amplifier 41) in the image data readout circuit are turned OFF so that only image data from the addressed photonic device appears on output line 48. The bias applied to the columns and the timing of the application is illustrated in FIG. 2.

Figure 3:
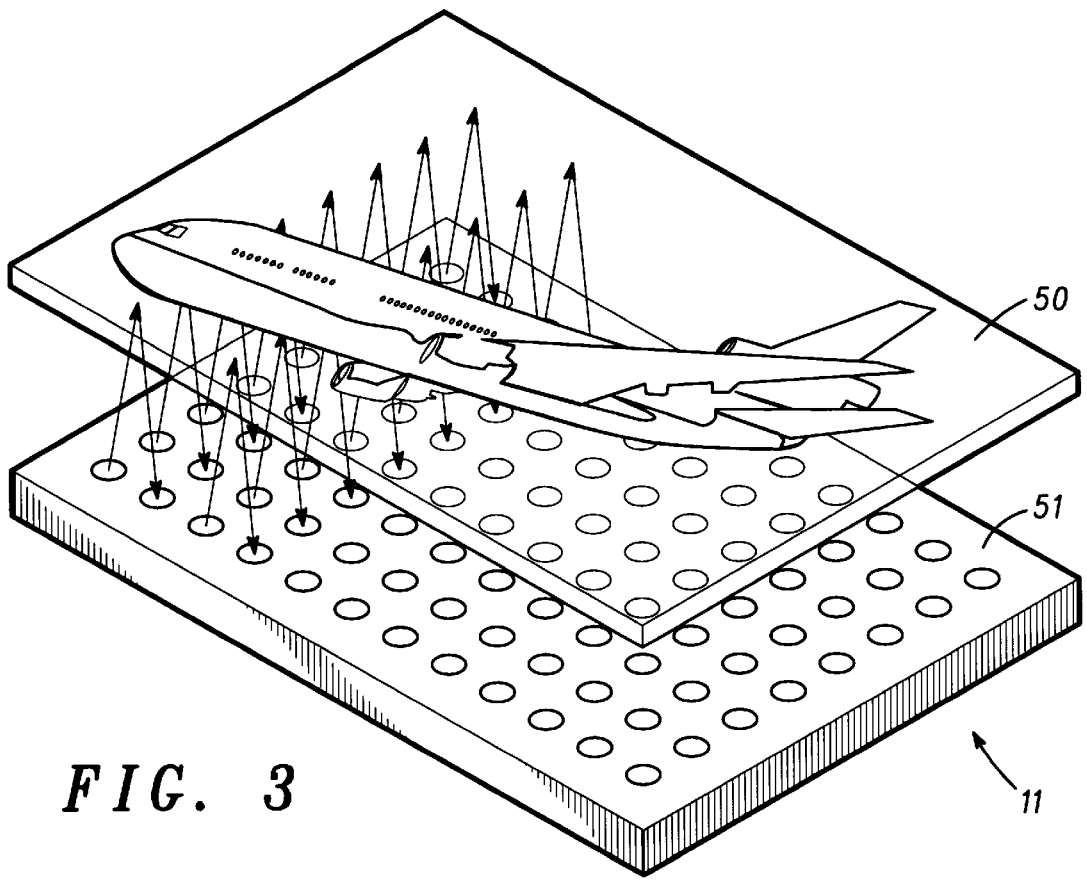
FIG. 3 is an isometric view of a simplified embodiment of the image scanner and display apparatus illustrated in FIG. 1, generally illustrating the operation.

Turning now to FIG. 3, an isometric view of a simplified embodiment of image scanner and display apparatus 10, generally showing the operation is illustrated. An information medium 50, such as a typed page, a photograph, etc. is positioned at a predetermined distance from an emission surface 51 of array 11. The individual photonic devices are then energized, as explained above, so that light emitted from one photonic device in a pair is directed onto information medium 50 and, depending upon the information displayed on the medium, will reflect light back to the other photonic device in the pair. For example, if the information is printed text on white paper, light will be reflected by plain white paper but little or no light will be reflected by the black printed text.

Figure 4:
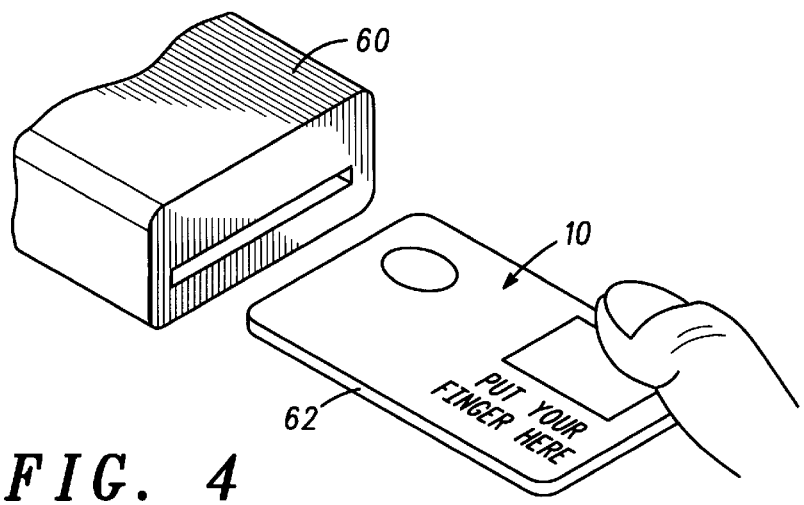
FIG. 4 is an isometric view, portions thereof broken away, of the image scanner and display apparatus of FIG. 1 incorporated into an electronic device.

Turning now to FIG. 4, an electronic device 60 is illustrated, and especially a portable electronic device such as a two way radio, a cellular telephone, a pager, a data bank, a smart card reader, etc. Device 60 either receives image data by way of received transmissions or contains image data which an operator desires to view. In the embodiment illustrated, device 60 is a smart card reader and a smart card 62 is positioned therein. Smart card 62 includes image scanner and display apparatus 10 (which may, in this specific embodiment operate only as a scanner). Apparatus 10 is a means of identification and when the operator places a finger on the surface of apparatus the image is read and converted to digital form. The digital data is then compared in device 60 to an original scan of the operator's finger print and positive identification is achieved. Similar use of image scanner and display apparatus 10 can be made in all of the other electronic apparatus. Further, image scanner and display apparatus 10 can be used as an information display when not required as a scanner.

While the embodiment illustrated is designed with all of the photonic devices of array 11 being capable of operating as either a light emitting device or a light detecting device, in accordance with the specific energization being applied, it will be understood by those skilled in the art that in some applications it might be useful to have alternate rows of photonic devices (e.g. 16, 18, etc.) only light emitting devices and the other rows (e.g. 17, 19, etc.) only light detecting devices. When this embodiment is in the display mode only the light emitting devices would be activated. While the resolution in the display mode would be somewhat poorer, the electronics might be simpler.

Accordingly, a new and improved scanner which does not require physical movement for scanning has been disclosed. Further, the new and improved scanner is relatively simple and inexpensive to manufacture and is relatively small and requires low operating power so that it can easily be incorporated into electronic devices, and especially portable electronic devices. Also, the new and improved scanner is easily integrated with a display, which makes it especially useful in various electronic circuits which may not only want to display data but scan data and send it to a remote source.

While we have shown and described specific embodiments of the present invention, further modifications and improvements will occur to those skilled in the art. We desire it to be understood, therefore, that this invention is not limited to the particular forms shown and we intend in the appended claims to cover all modifications that do not depart from the spirit and scope of this invention.

What is claimed is:

1. Image scanner and display apparatus comprising:
   an array of photonic devices arranged into rows and columns, the columns of photonic devices including a first plurality of spaced apart columns of light emitting devices and a second plurality of columns of light detecting devices alternately positioned between the first plurality of spaced apart columns of light emitting devices so that each column of the first plurality of spaced apart columns has an associated second column of light detecting devices; and
   electronics coupled to the array of photonic devices and having a display mode or operation and a scanner mode of operation, the electronics being constructed to operate in the display mode to sequentially forward bias the array of organic electroluminescent devices in accordance with image data supplied thereto, one row at a time, to emit light and to produce an image representative of the data supplied, and to operate in the scanner mode to sequentially forward bias the first plurality of spaced apart columns of light emitting devices, one column at a time, to emit light and to reverse bias the associated second column of light detecting devices for each first column forward biased, whereby light emitted from forward biased first columns and reflected by information being scanned is received by the reverse biased associated second column.

2. Image scanner and display apparatus as claimed in claim 1 wherein the electronics includes a shift register connected to the array so as to shift image data into the array one row at a time.

3. Image scanner and display apparatus as claimed in claim 2 wherein the image scanner and display are incorporated into an electronic device and receive the image data from the electronic device.

4. Image scanner and display apparatus as claimed in claim 3 wherein the electronic device is one of a two way radio, a cellular telephone, a pager, a smart card reader, or a data bank.

5. Image scanner and display apparatus as claimed in claim 1 wherein the first and second columns alternate across the entire array.

6. Image scanner and display apparatus as claimed in claim 1 wherein the array of photonic devices includes organic light emitting devices.

7. Image scanner and display apparatus comprising:
   an array of organic electroluminescent devices arranged into rows and columns, each organic electroluminescent device being constructed to operate as a light emitter when forward biased and to act as a light detector when reverse biased, the array of organic electroluminescent devices including a first plurality of spaced apart columns of organic electroluminescent devices and a second plurality of columns of organic electroluminescent devices alternately positioned between the first plurality of spaced apart columns of light emitting devices so that each column of the first plurality of spaced apart columns has an associated second column of organic electroluminescent devices; and
   electronics coupled to the array of organic electroluminescent devices and having a display mode of operation and a scanner mode of operation, the electronics being constructed to operate in the display mode to sequentially forward bias the array of organic electroluminescent devices in accordance with image data supplied thereto, one row at a time, to emit light and to produce an image representative of the data supplied, and to operate in the scanner mode to sequentially forward bias the first plurality of spaced apart columns of organic electroluminescent devices, one column at a time, to emit light and to reverse bias the associated second column of organic electroluminescent devices for each first column forward biased, whereby light emitted from forward biased first columns and reflected by information being scanned is received by the reverse biased associated second column.

8. Image scanner and display apparatus as claimed in claim 7 wherein the electronics are connected to a source of data to receive image data and to provide an image representative of received image data.

9. Image scanner and display apparatus as claimed in claim 8 wherein the electronics includes a shift register connected to the array so as to shift image data into the array one row at a time.

10. A method of scanning an image comprising the steps of:
    providing an array of photonic devices arranged into rows and columns, the columns of photonic devices including a first plurality of columns, with each photonic device in the first plurality of columns being sequentially forward biased to operate as a light emitting device, and a second plurality of columns with each photonic device in the second plurality of columns being sequentially reverse biased to operate as a light detecting device, the second plurality of columns being positioned adjacent the first plurality of columns of light emitting devices so that each column of the first plurality of spaced apart columns has an associated second column of photonic devices;

providing electronics coupled to the array of photonic devices and having a display mode of operation and a scanner mode of operation;

sequentially forward biasing the array of photonic devices in the display mode in accordance with image data supplied thereto, one row at a time, to emit light and to produce an image representative of the data supplied;

sequentially forward biasing in the scanner mode the first plurality of columns of light emitting devices, one column at a time, to emit light and sequentially reverse biasing the associated second column of light detecting devices for each first column sequentially forward biased, to detect light; and directing light emitted by each sequentially forward biased first column onto information to be scanned so that light emitted from sequentially forward biased first columns is reflected by information being scanned and received by the associated sequentially reversed biased second column.

11. A method of scanning an image as claimed in claim 10 wherein the step of providing the array of photonic devices includes providing an array of organic electroluminescent devices.

12. A method of scanning an image as claimed in claim 11 wherein the step of providing the array of photonic devices further includes providing an array of organic electroluminescent devices each constructed to operate as a light emitter when forward biased and to act as a light detector when reverse biased.

13. A method of scanning an image and displaying an image comprising the steps of:

providing an array of organic electroluminescent devices arranged into rows and columns and each constructed to operate as a light emitter when forward biased and to operate as a light detector when reverse biased;

providing electronics coupled to the array of organic electroluminescent devices and having a display mode of operation and a scanner mode of operation;

supplying image data to the array, one row at a time, representative of an image to be displayed;

sequentially forward biasing the array of organic electroluminescent devices, one row at a time, in the display mode in accordance with the image data supplied thereto, to emit light and provide an image representative of the image data supplied; and sequentially forward biasing in the scanner mode a first plurality of columns of light emitting devices, one column at a time, to emit light and sequentially reverse biasing an associated second column of organic electroluminescent devices for each first column sequentially forward biased, to detect light, and directing light emitted by each sequentially forward biased first column onto information to be scanned so that light emitted from sequentially forward biased first columns is reflected by information being scanned and received by the associated sequentially reversed biased second column in a scanning mode.

14. A method of scanning an image and displaying an image as claimed in claim 13 including in addition a step of incorporating the image scanner and display into an electronic device and receiving the image data from the electronic device.

* * * * *